(12) United States Patent
Yamamura

(10) Patent No.: US 7,706,070 B2
(45) Date of Patent: Apr. 27, 2010

(54) LENS ARRAY, EXPOSURE DEVICE, IMAGE FORMING APPARATUS AND LED HEAD

(75) Inventor: Akihiro Yamamura, Tokyo (JP)

(73) Assignee: Oki Data Corporation, Tokyo (JP)

( * ) Notice: Subject to any disclaimer, the term of this patent is extended or adjusted under 35 U.S.C. 154(b) by 0 days.

(21) Appl. No.: 11/902,755

(22) Filed: Sep. 25, 2007

(65) Prior Publication Data
US 2008/0080046 A1 Apr. 3, 2008

(30) Foreign Application Priority Data
Sep. 29, 2006 (JP) .............................. 2006-267408

(51) Int. Cl.
*G02B 27/10* (2006.01)
(52) U.S. Cl. ...................... 359/619; 359/618
(58) Field of Classification Search ................. 359/619
See application file for complete search history.

(56) References Cited

U.S. PATENT DOCUMENTS

| 6,381,072 | B1 * | 4/2002 | Burger ........................ 359/622 |
| 2001/0033422 | A1 * | 10/2001 | Miura et al. ................. 359/621 |
| 2002/0149846 | A1 * | 10/2002 | Goto et al. .................. 359/456 |
| 2009/0009861 | A1 * | 1/2009 | Hyobu ........................ 359/456 |

FOREIGN PATENT DOCUMENTS

| JP | 2000-221445 | | 8/2000 |
| WO | WO 2007/091708 | * | 8/2007 |

* cited by examiner

*Primary Examiner*—Jordan M. Schwartz
*Assistant Examiner*—James C Jones
(74) *Attorney, Agent, or Firm*—Rabin & Berdo, P.C.

(57) ABSTRACT

A lens array includes a plurality of lens pairs each of which includes lenses so disposed that optical axes thereof are aligned with each other. The lens pairs are arranged in a direction perpendicular to the optical axes. The lens array further includes a light-blocking portion provided between the lens pairs. The light-blocking portion is formed to have a structure split into at least two parts in a predetermined direction.

21 Claims, 12 Drawing Sheets

LENS ARRAY, EXPOSURE DEVICE, IMAGE FORMING APPARATUS AND LED HEAD

BACKGROUND OF THE INVENTION

This invention relates to a lens array, an exposure device, an image forming apparatus and an LED head.

There is known an image forming apparatus such as a printer, a copier, a compound machine or the like using an array of LEDs (for example, an LED printer). Such an image forming apparatus uses an array of rod lenses for focusing the lights emitted by light emitting portions (i.e., the LEDs) onto a surface of a photosensitive drum.

The rod lens is formed of a glass fiber impregnated with ion so that the refractive index thereof decreases from the center portion toward the peripheral portion. The rod lenses functions as an optical element that forms an erected image of an object at the same magnification. The lens array in which the rod lenses are arranged in a plurality of rows is used as an optical system for focusing an image of an object as a linear image.

Recently, there is proposed another lens array including micro lenses disposed in the direction of the optical axis at an interval corresponding to the focal length (see, for example, Japanese Laid-Open Patent Publication No. 2000-221445). The micro lenses are also arranged in the direction perpendicular to the optical axis.

However, in the lens array using the micro lenses, it is necessary to provide a light-blocking portion for preventing the light from passing through adjacent micro lenses (i.e., the micro lenses that are not aligned with each other). Such a light-blocking portion needs to have openings arranged at an arrangement interval corresponding to an arrangement interval of the micro lenses. In the case where the arrangement interval of the openings is narrow, it becomes difficult to form the openings, and it becomes difficult to reduce the error of the arrangement interval of the openings. As a result, it becomes difficult to form the openings correctly in accordance with the positions of the micro lenses.

SUMMARY OF THE INVENTION

The present invention is intended to solve the above described problems, and an object of the present invention is to provide a lens array, an exposure device, an image forming apparatus and an LED head using a light-blocking portion having openings that can be easily formed and correctly aligned with positions of lenses.

The present invention provides a lens array including a plurality of lens pairs each of which includes a plurality of lenses so disposed that optical axes thereof are aligned with each other. The lens pairs are arranged in a direction perpendicular to the optical axes. The lens array further includes a light-blocking portion provided between the lens pairs and configured to partially block light passing through at least one lens of the lens pairs. The light-blocking portion is formed to have a structure split into at least two parts in a predetermined direction.

Since the light-blocking portion has the structure split in the predetermined direction, it becomes easy to machine the light-blocking portion, and it becomes easy to form openings correctly in accordance with the positions of the lenses.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DETAILED DESCRIPTION OF THE PREFERRED EMBODIMENT

Hereinafter, embodiments of the present invention will be described with reference to the attached drawings. In this regard, a printer as an image forming apparatus will be described.

Figure 1:
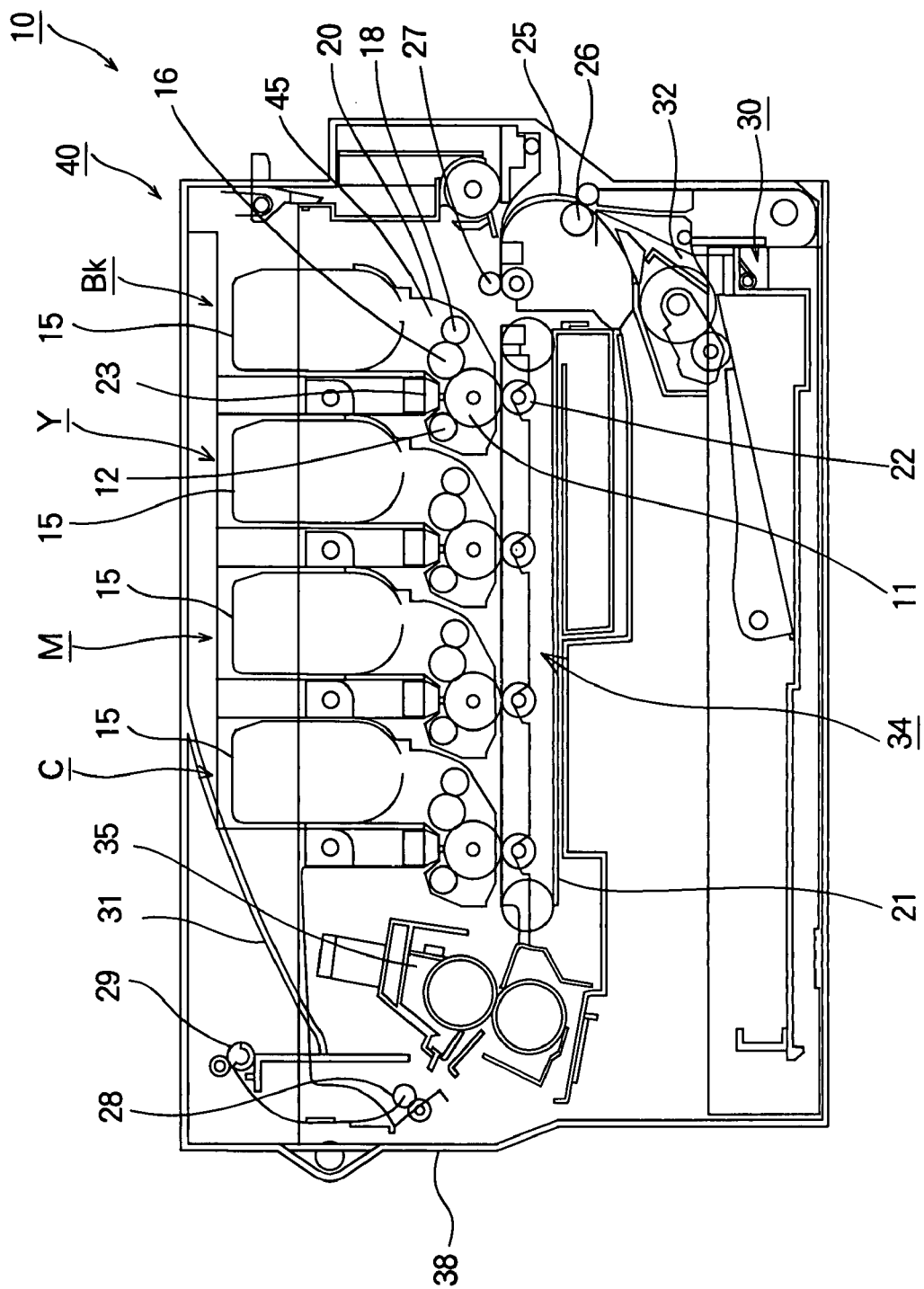
FIG. 1 is a schematic view showing a printer according to the first embodiment of the present invention.

FIG. 1 is a schematic view showing a printer according to the first embodiment of the present invention.

In FIG. 1, a printer includes a main body 10 (i.e., an apparatus main body) in which a substantially S-shaped feeding path 25 is provided for feeding a not shown sheet (i.e., a medium). Feeding rollers 26, 27, 28 and 29 are disposed along the feeding path 25. Image forming units (i.e., ID units) Bk, Y, M and C are disposed along the feeding path 25, for forming the toner images (i.e., developer images) of the respective colors. A transfer unit 34 is disposed below the image forming units Bk, Y, M and C, for feeding the sheet and for transferring the respective toner images to the sheet. The feeding path 25 is formed between the respective image forming units Bk, Y, M and C and the transfer unit 34. The transfer unit 34 constitutes a belt driving unit.

LED heads 23 (i.e., exposure devices or recording heads) are disposed in the printer 10 in such a manner that the LED heads 23 face respective photosensitive drums (i.e., image bearing bodies) 11 of the image forming units Bk, Y, M and C. A fixing unit 35 is disposed on the downstream side of the transfer unit 34, for fixing the toner image (having been transferred to the sheet) to the sheet.

In each of the image forming units Bk, Y, M and C, the photosensitive drum 11 has an electrically chargeable surface, and rotates at a predetermined speed. The surface of the photosensitive drum 11 is exposed with light emitted by the LED head 23, and the electric charge of the exposed surface of the photosensitive drum 11 is removed, so that the latent image is formed thereon. A charging roller 12 (i.e., a charging device) is urged against the photosensitive drum 11 at a constant pressure. The charging roller 12 rotates in the direction opposite to the rotational direction of the photosensitive drum 11 and applies a predetermined voltage to the surface of the photosensitive drum 11.

Further, a developing device 45 is disposed in opposition to the photosensitive drum 11, and develops the latent image to form a toner image. The developing device 45 includes a developing roller 16 (i.e., a developer bearing body) causing the toner to adhere to the photosensitive drum 11, a not shown developing blade (i.e., a regulating member) regulating the thickness of the toner layer formed on the surface of the developing roller 16, a toner supply roller 18 (i.e., a developer supply roller) supplying the toner to the developing roller 16, and the like. The developing roller 16 is urged against the photosensitive drum 11 at a constant pressure, and rotates in the direction opposite to the rotational direction of the photosensitive drum 11. The toner supply roller 18 is urged against the developing roller 16 at a constant pressure, and rotates in the same direction as the rotational direction of the developing roller 16.

The photosensitive drum 11, the charging roller 12, the developing device 45 and the like are housed in a casing 20 that constitutes a main body of the image forming unit. On the upper side of each casing 20, a toner cartridge 15 (as a developer storing portion) storing the toner is detachably attached to the casing 20.

The transfer unit 34 includes a movable transfer belt 21, and transfer rollers 22 (i.e., transfer members) respectively disposed in opposition to the photosensitive drums 11. The transfer belt 21 and the transfer rollers 22 are applied with predetermined voltages by not shown power sources, and transfer the respective toner images from the photosensitive drums 11 to the sheet.

The main body 10 of the printer includes a lower frame 38 and an upper frame 40 swingably provided on the lower frame 38. The upper frame 40 has a stacker 31 for stacking the ejected sheets thereon. Below the transfer unit 34, a sheet cassette 30 (i.e., a media storing portion) is provided at the end portion of the sheet feeding path 25, and stores the sheets. The sheet cassette 30 has a sheet pickup portion 32 that picks up and feeds the sheet out of the sheet cassette 30.

The operation of the above described printer will be described.

In the image forming units Bk, Y, M and C, the charging rollers 12 uniformly charge the surfaces of the photosensitive drums 11. The LED heads 23 expose the surfaces of the photosensitive drums 11, and form latent images thereon. Then, the developing devices 45 develop the latent images and form toner images of the respective colors.

The sheet is picked up by the sheet pickup portion 32 and is fed out of the sheet cassette 30. The sheet is fed by the feeding rollers 26 and 27, and adheres to the transfer belt 21 by means of an electrostatic effect. By the movement of the transfer belt 21, the sheet is fed through between the image forming units Bk, Y, M and C and the transfer unit 34, and the toner images of the respective colors are transferred to the sheet in an overlapping manner, with the result that the color toner image is formed on the sheet. Then, the sheet reaches the fixing unit 35, and the color toner image is fixed to the sheet. Then, the sheet is further fed by the feeding rollers 28 and 29, and is ejected to the stacker 31.

The printer includes an external interface (not shown) for communicating with an external device and for receiving print data. The printer further includes a control unit that receives the print data via the external interface and controls the whole of the printer.

The above described LED head 23 will be described.

Figure 2:
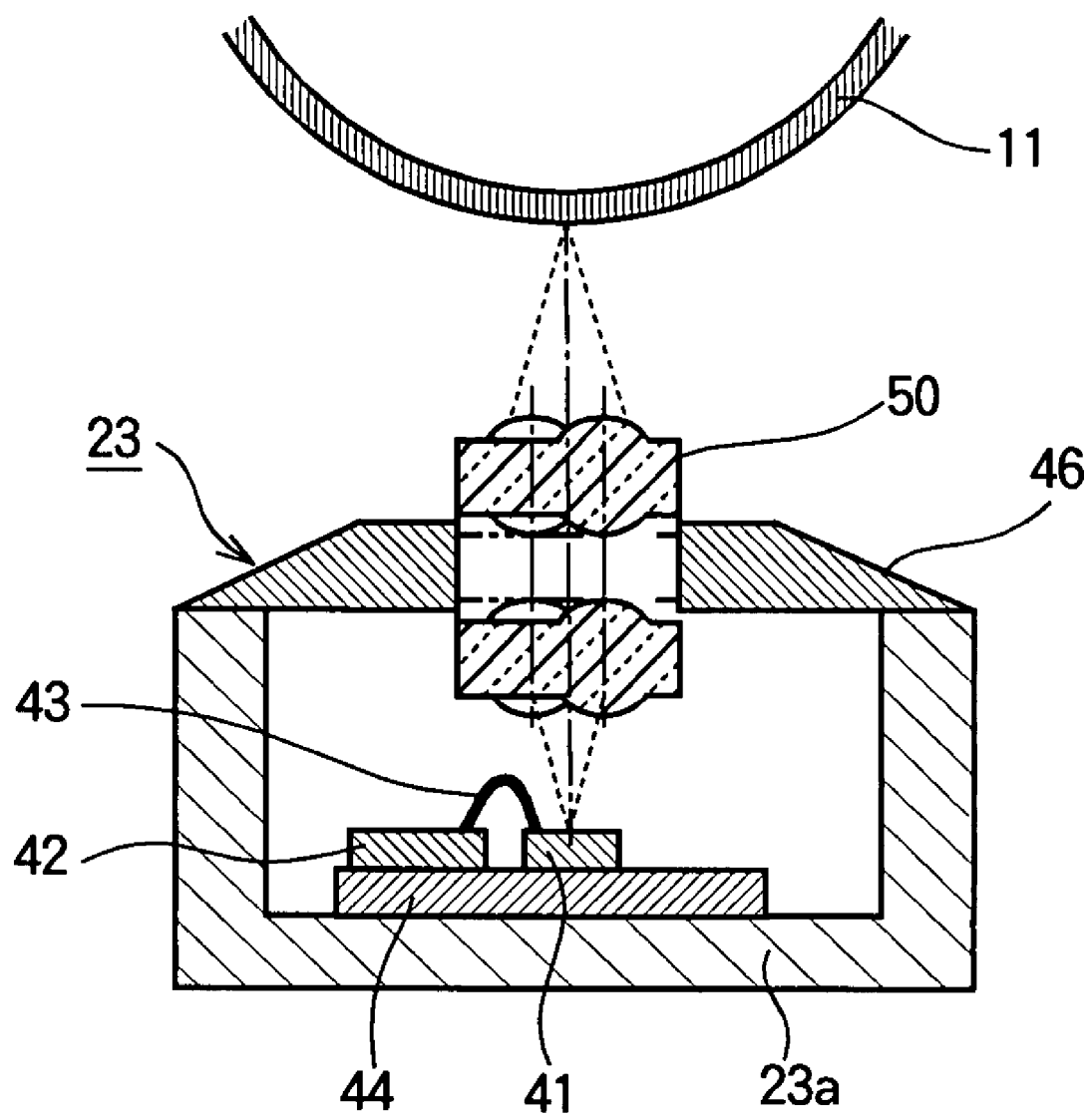
FIG. 2 is a cross sectional view showing an LED head according to the first embodiment of the present invention.

FIG. 2 is a cross sectional view of the LED head 23 according to the first embodiment of the present invention.

As shown in FIG. 2, the LED head 23 includes a lens array 50. The lens array 50 is fixed to a supporting body 23a by means of a holding member 46.

The LED head 23 includes light emitting portions 41 that emit light to the photosensitive drum 11. The light emitting portions 41 include a plurality of LED elements (i.e., light emitting elements) linearly arranged at constant intervals. In this embodiment, the number of the LED elements per inch (approximately 2.5 cm) is 600. A light-blocking member (not shown) is disposed between the light emitting portions 41 and the lens array 50.

The light emitting portions 41 and a driver IC 42 for controlling the light emission of the LED elements of the light emitting portions 41 are provided on a wiring substrate 44 (disposed on the supporting body 23a). The light emitting portions 41 and the driver IC 42 are connected with each other by means of wires 43.

The operation of the above described LED head 23 will be described.

First, the above described control unit generates control signal for the LED head 23 in accordance with the image data, and sends the control signal to the driver IC 42. The driver IC 42 causes the LED elements of the light emitting portions 41 to respectively emit lights of predetermined amounts according to the control signal. Then, the lights emitted by the respective LED elements are incident on the lens array 50, pass through the lens array 50, and are focused on the photosensitive drum 11, so that the focused images of the light emitting portions 41 are formed on the photosensitive drum 11.

The above described lens array 50 will be described.

Figure 3:
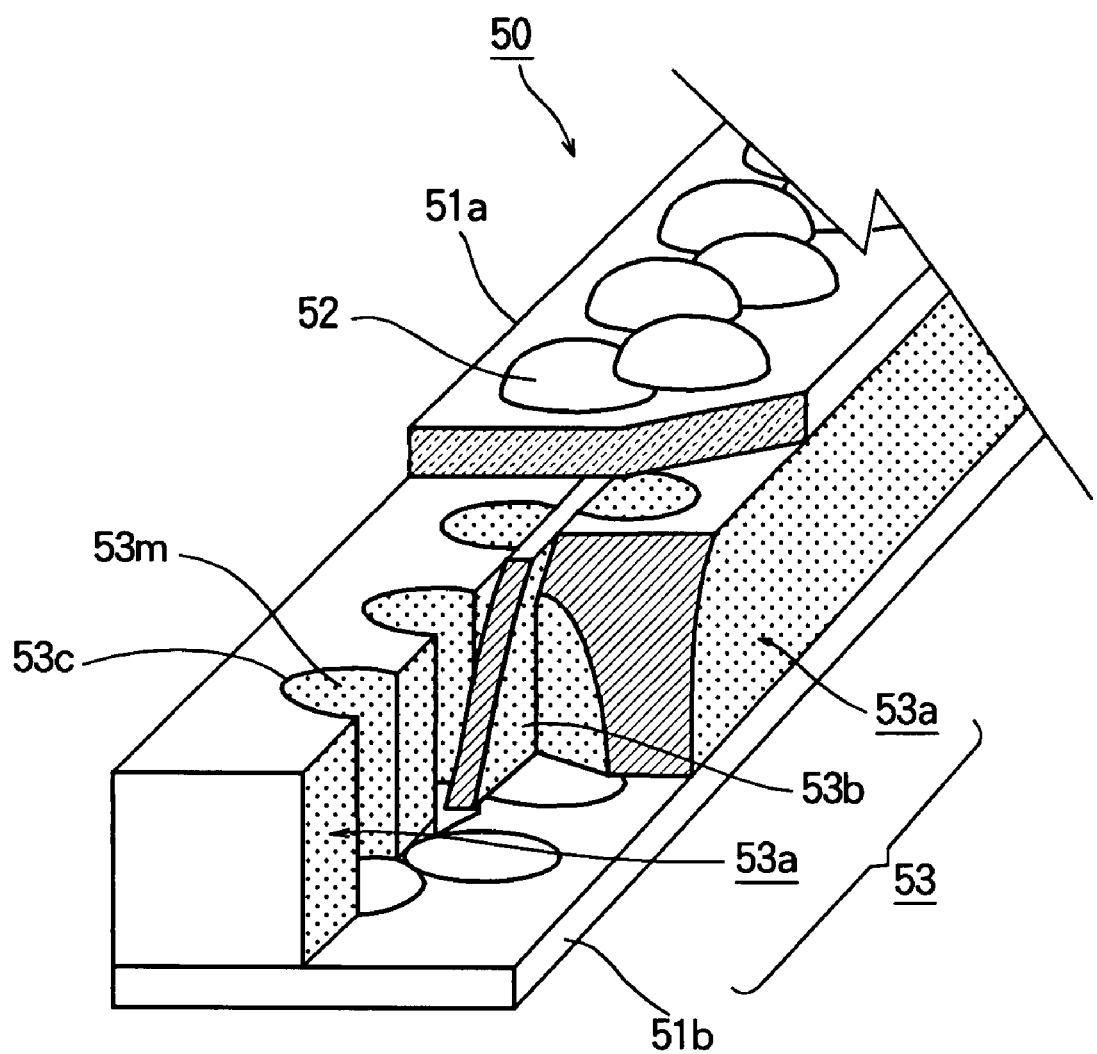
FIG. 3 is a partially cutaway perspective view showing a lens array according to the first embodiment of the present invention.
Figure 4:
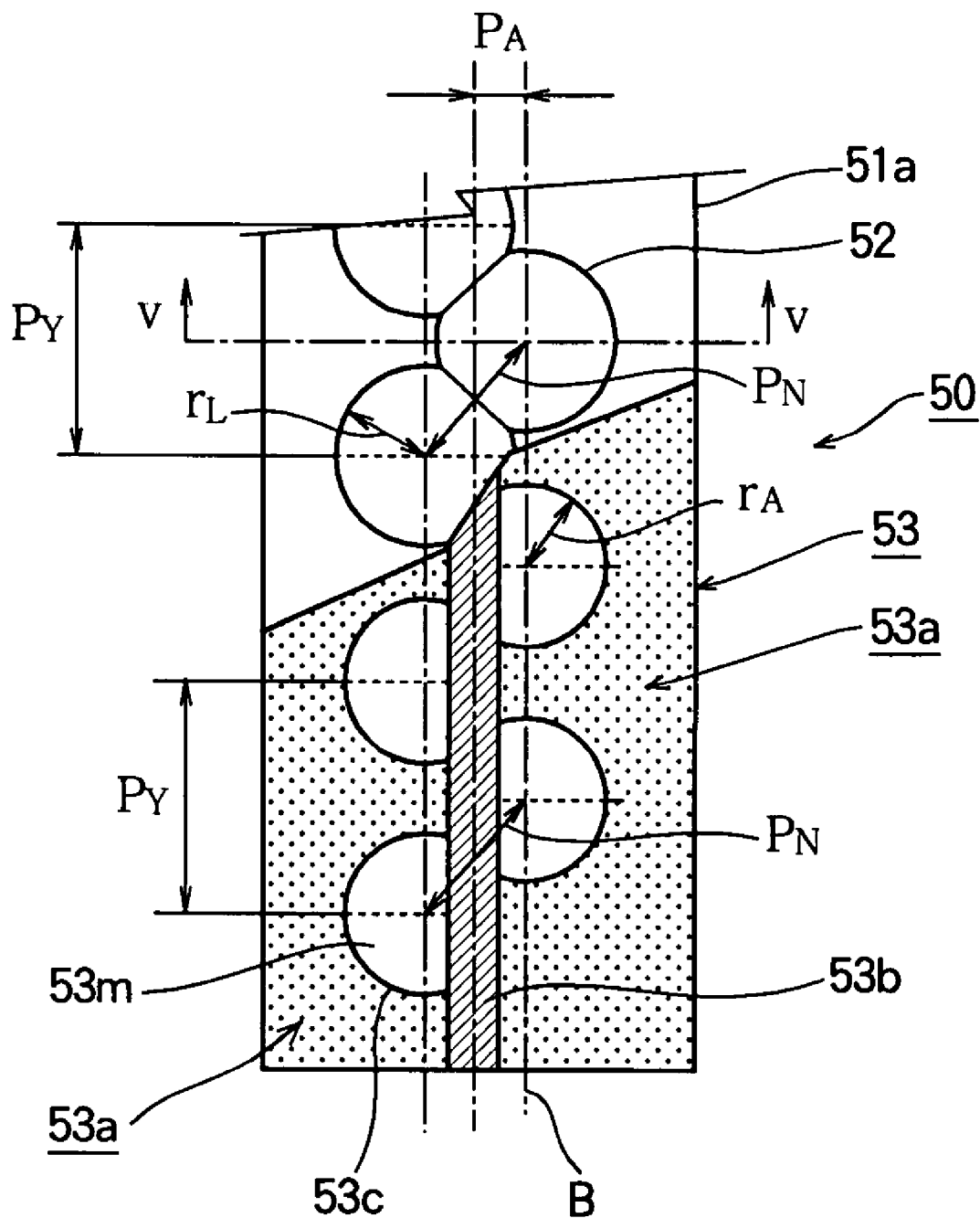
FIG. 4 is a partially cutaway plan view showing the lens array according to the first embodiment of the present invention.
Figure 5:
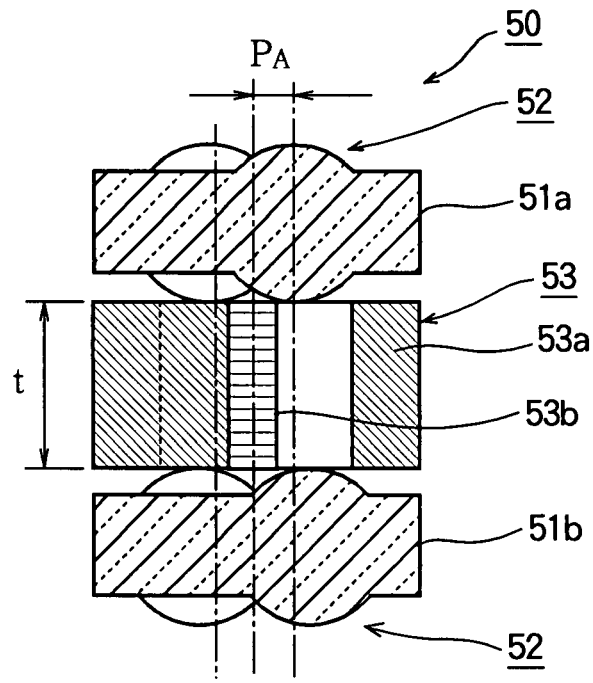
FIG. 5 is a cross sectional view taken along line V-V shown in FIG. 4.
Figure 6:
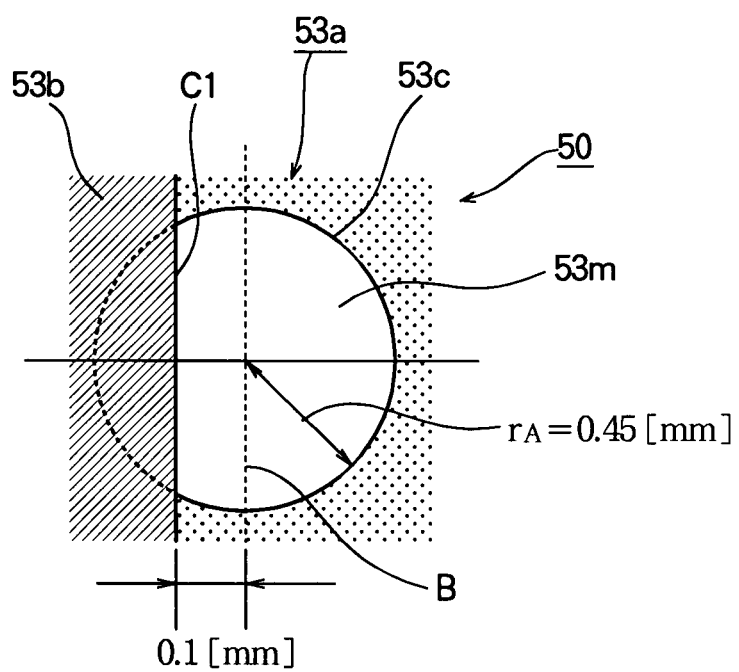
FIG. 6 is a plan view showing a part of the lens array according to the first embodiment of the present invention.

FIG. 3 is a partially cutaway perspective view showing the lens array 50 according to the first embodiment of the present invention. FIG. 4 is a partially cutaway plan view showing the lens array 50 according to the first embodiment of the present invention. FIG. 5 is a cross sectional view taken along line V-V shown in FIG. 4. FIG. 6 is a plan view showing a part of the lens array according to the first embodiment of the present invention.

As shown in FIGS. 3 through 5, the lens array 50 includes a pair of lens plates 51a and 51b that face with each other. The lens array 50 further includes a light-blocking portion 53 disposed between the lens plates 51a and 51b and made of material that blocks the light. The light-blocking portion 53 has a plurality of openings 53c. A plurality of micro lenses 52 of the radius $r_L$ are integrally formed with each of the lens plates 51a and 51b. The micro lenses 52 are disposed at the center portions of the lens plates 51a and 51b in the width direction. Further, the micro lenses 52 are arranged in two rows in the direction perpendicular to the optical axes of the micro lenses 52, and are arranged in a staggered manner. The micro lenses 52 constitute lens groups (in this example, lens pairs) arranged in the direction perpendicular to the optical axes, and each lens pair includes a plurality of lenses (in this example, two lenses) so disposed that the optical axes thereof are aligned with each other. The light-blocking portion 53 is provided between the lens pairs. Each micro lens 52 constitutes an optical system that forms an inverted image of an object at the reduced magnification, and the lens pair constitutes an optical system that forms an erected image of an object at the same magnification.

The light-blocking portion 53 has a plurality of openings 53c corresponding to the respective micro lenses 52 for allowing the passage of the light. The optical axes of the micro lenses 52 are almost aligned with the centers of the openings 53c.

The light-blocking portion 53 is formed to have a structure split into at least two parts in a predetermined direction. In this embodiment, the light-blocking portion 53 is split in the width direction of the lens array 50 which is perpendicular to the optical axes of the micro lenses 52 and is also perpendicular to the arranging direction of the micro lenses 52.

Further, the light-blocking portion 53 is formed of two comb-like members 53a. Each comb-like member 53a has a plurality of grooves 53m (corresponding to the respective micro lenses 52) formed on a side of the comb-like member 53a. The light-blocking portion 53 further includes a partition plate 53b disposed between the comb-like members 53a. When the comb-like members 53a and the partition plate 53b are combined, the grooves 53m constitute the openings 53c. The comb-like members 53a and the partition plate 53b are made of a material that blocks the light emitted by the light source (i.e., the light emitting portions 41). The length (thickness) of the comb-like member 53a in the direction of the optical axes of the micro lenses 52 is defined as the thickness t of the light-blocking portion 53 in the direction of the optical axes of the micro lenses 52.

Figure 7:
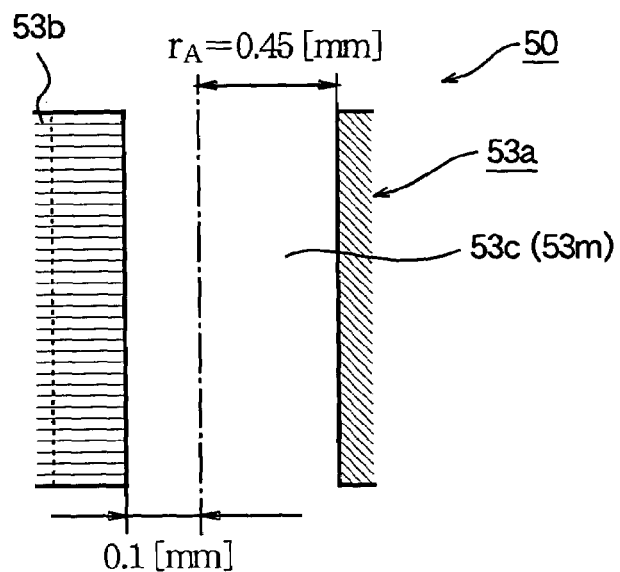
FIG. 7 is a sectional view showing the part of the lens array according to the first embodiment of the present invention.

As shown in FIGS. 6 and 7, in a cross section perpendicular to the center line of the groove 53m, the groove 53m (i.e., the opening 53c) has a shape of a circle of the radius $r_A$ partially cut off. To be more specific, the groove 53m has a shape of a circle of the radius $r_A$ cut off by a plane C1 (at a distance of 0.1 mm from the center of the circle) parallel to a plane B (FIG. 6) passing through the centers of the circles and extending in arranging direction of the openings 53c.

Referring back to FIG. 4, an arrangement interval of the micro lenses 52 (i.e., the center-to-center distance of the micro lenses 52 in the direction in which the micro lenses 52 are arranged) of the respective lens plates 51a and 51b and the arrangement interval of the openings 53c of the light-blocking portion 53 are the same as each other. The arrangement interval of the micro lenses 52 in the arranging direction is referred to as an arrangement interval $P_Y$. Further, the interval (i.e., the center-to-center distance) between the closest micro lenses 52 (i.e., micro lenses 52 adjacent to each other across the rows) is referred to as an arrangement interval $P_N$. The arrangement intervals $P_Y$ and $P_N$ satisfy the relationship:

$$P_Y > P_N$$

The distance between the center line of each row of the lens plate 51a (51b) and the center line of the lens plate 51a (51b) is referred to as a row-center-to-array-center distance $P_A$. The row-center-to-array-center distance $P_A$ is expressed as following equation (1):

$$P_A = \sqrt{\left(\frac{P_N}{2}\right)^2 - \left(\frac{P_Y}{4}\right)^2} \quad (1)$$

Further, the comb-like members 53a are so disposed that the centers of the grooves 53m of one comb-like member 53a are shifted from the centers of the grooves 53m of the other com-like member 53a by an amount equal to $P_Y/2$ in the arranging direction of the grooves 53m.

A lens array 50 of the specific example of the first embodiment is prepared for the verification of the advantages of the first embodiment of the present invention. In the lens array 50 of the specific example, the lens plates 51a and 51b are formed of cycloolefin-based resin "ZEONEX E48R" (product name) manufactured by Nihon Zeon Corporation, and the micro lenses 52 are integrally formed with each of the lens plates 51a and 51b by resin molding. The arrangement interval $P_Y$ of the micro lenses 52 in the arranging direction is 1.200 mm. The arrangement interval $P_N$ between the closest micro lenses 52 is 1.000 mm. The row-center-to-array-center distance $P_A$ is 0.400 mm.

In the lens array 50 of the specific example, the thickness t of the light-blocking portion 53 in the direction of the optical axes of the micro lenses 52 is 2.5 mm. The light-blocking portion 53 is formed of an aluminum sheet metal with a non-reflection coating layer formed thereon using black alumite treatment, and the grooves 53m are formed by wire-cutting. The radius $r_A$ of the opening 53c is 0.45 mm.

The lens array 50 of the specific example of the first embodiment is configured as shown in the following TABLE 1.

TABLE 1

| MARK | PROPERTIES | SPECIFIC EXAMPLE OF FIRST EMBODIMENT |
|---|---|---|
| $P_Y$ | ARRANGEMENT INTERVAL OF MICRO LENSES IN ARRANGING DIRECTION(mm) | 1.200 |
| $P_N$ | ARRANGEMENT INTERVAL BETWEEN CLOSEST MICRO LENSES(mm) | 1.000 |
| $P_A$ | ROW-CENTER-TO-ARRAY-CENTER DISTANCE (mm) | 0.400 |

TABLE 1-continued

| MARK | PROPERTIES | SPECIFIC EXAMPLE OF FIRST EMBODIMENT |
|---|---|---|
| $L_O$ | DISTANCE BETWEEN OBJECT PLANE AND LENS SURFACE (mm) | 2.300 |
| $r_L$ | RADIUS OF MICRO LENS (mm) | 0.500 |
| $C_O$ | RADIUS OF CURVATURE OF OUTER CURVED SURFACE (mm) | 0.8645 |
| $A_O$ | 4TH ORDER ASPHERICAL COEFFICIENT OF OUTER CURVED SURFACE | −0.3845 |
| $B_O$ | 6TH ORDER ASPHERICAL COEFFICIENT OF OUTER CURVED SURFACE | −0.2100 |
| $C_I$ | RADIUS OF CURVATURE OF INNER CURVED SURFACE (mm) | −0.8908 |
| $A_I$ | 4TH ORDER ASPHERICAL COEFFICIENT OF INNER CURVED SURFACE | 0.4542 |
| $B_I$ | 6TH ORDER ASPHERICAL COEFFICIENT OF INNER CURVED SURFACE | −0.0753 |
| $L_T$ | LENS THICKNESS (mm) | 1.000 |
| $L_S$ | DISTANCE BETWEEN LENS SURFACES (mm) | 2.540 |
| $r_A$ | OPENING DIMENSION OF LIGHT-BLOCKING PORTION (mm) | 0.450 |
| $L_I$ | DISTANCE BETWEEN IMAGE PLANE AND LENS SURFACE (mm) | 2.300 |
| TC | DISTANCE BETWEEN IMAGE PLANE AND OBJECT PLANE (mm) | 9.140 |

Figure 8:
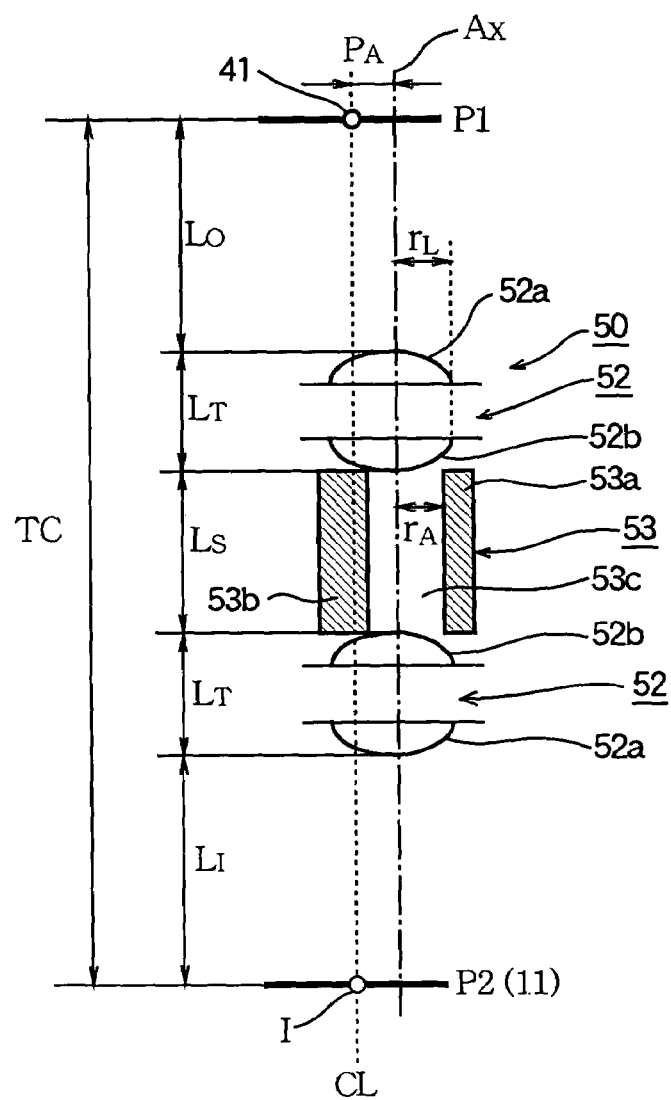
FIG. 8 is a sectional view showing the relationship between the lens array and a photosensitive drum according to the first embodiment of the present invention and a photosensitive drum.

FIG. 8 is a schematic view showing the relationship between the lens array and the photosensitive drum according to the first embodiment of the present invention.

As shown in FIG. 8, the mark $L_O$ indicates the distance between the lens array 50 and the light emitting portion 41 (i.e., the distance between an object plane and a lens surface), and is defined by the distance between the apex of an outer curved surface 52a of the micro lens 52 and a plane (i.e., an object plane P1) on which the light emitting portions 41 are arranged. The mark $L_I$ indicates the distance (i.e., the distance between an image plane and a lens surface) between the lens array 50 and the photosensitive drum 11 on which an image I is focused, and is defined by the distance between the apex of an outer curved surface 52a of the micro lens 52 and a plane on which the photosensitive drum 11 is disposed (i.e., an image plane P2). The mark $L_T$ indicates the lens thickness $L_T$, and is defined by the distance between the outer curved surface 52a and the inner curved surface 52b of the micro lens 52. The mark $L_S$ indicates the distance between lens surfaces, and is defined by the distance between the respective inner curved surfaces 52b of the micro lenses 52 of the lens pair. The mark TC indicates the distance between the image plane P2 and the object plane P1, and is defined by the distance between the photosensitive drum 11 and the light emitting portion 41. The mark $r_L$ indicates the radius of the micro lens 52. The mark $r_A$ indicates the radius of the opening 53c of the light-blocking portion 53.

The outer curved surface 52a and the inner curved surface 52b of the micro lens 52 are rotationally-symmetric high-order aspheric surfaces, and expressed as the following equation (2):

$$Z(r) = \frac{\frac{r^2}{C}}{1 + \sqrt{1 - \left(\frac{r}{C}\right)^2}} + A \cdot r^4 + B \cdot r^6 \quad (2)$$

The function $Z(r)$ indicates a rotating coordinate system whose axis is parallel to the optical axis of the micro lens 52 and in which the radial coordinate is expressed as "r". The apexes of the outer curved surface 52a and the inner curved surface 52b of the micro lens 52 are defined as original points. The direction from the object plane toward the image plane is expressed as being positive number. The mark C indicates a radius of curvature of the curved surface of the micro lens 52 (i.e., the mark $C_O$ for the outer curved surface 52a, and the mark $C_I$ for the inner curved surface 52b). The mark $A_O$ indicates a fourth-order aspherical coefficient of the curved surface of the micro lens 52 (i.e., the mark $A_O$ for the outer curved surface 52a, and the mark $A_I$ for the inner curved surface 52b). The mark B indicates a sixth-order aspherical coefficient of the curved surface of the micro lens 52 (i.e., the mark $B_O$ for the outer curved surface 52a, and the mark $B_I$ for the inner curved surface 52b).

Although the micro lenses 52 are integrally formed with the respective lens plates 51a and 51b in this embodiment, it is also possible to individually form the micro lenses 52 and to fix the micro lenses 52 to the respective lens plates 51a and 51b at the predetermined intervals $P_Y$ and $P_N$.

Although the outer and inner curved surfaces 52a and 52b have rotationally-symmetric high-order aspheric surfaces in this embodiment, the outer and inner curved surfaces 52a and 52b can be spherical surfaces. Moreover, the outer and inner curved surfaces 52a and 52b can be conic surfaces (such as paraboloidal surfaces, ellipsoidal surfaces, hyperboloidal surfaces or the like), toroidal surfaces (asymmetric in the respective directions perpendicular to the optical axis) and cylindrical surfaces or the like. Further, the outer and inner curved surfaces 52a and 52b can be conventional free curved surfaces.

In this embodiment, since the outer and inner curved surfaces 52a and 52b are formed as aspherical surfaces, the aberration can be smaller than the micro lens having spherical surfaces, and therefore the resolution can be enhanced. Further, since the outer and inner curved surfaces 52a and 52b are formed to be rotationally-symmetric, the structure of the micro lens 52 can be simpler than the micro lens having asymmetrical surfaces.

Further, although the micro lens 52 of the this embodiment is composed of a single lens having two refracting surfaces (curved surfaces), it is also possible to use a compound lens (a combination of a plurality of single lenses) having four or more refracting surfaces.

Although the micro lens 52 is formed of a transparent material (transmitting the light emitted by the light source) having a uniform refractive index and having predetermined curved surfaces, it is also possible to use a lens, optical fibers or the like having a predetermined distribution of the refractive index.

Further, although the light-blocking portion 53 is formed of aluminum sheet metal in this embodiment, the light-blocking portion 53 is not limited to the aluminum sheet metal. The method of forming the light-blocking portion 53 is not limited to the wire cutting, but the light-blocking portion 53 can be formed using conventional etching treatment. Further, the light-blocking portion 53 can also be formed using injection molding of resin.

Although the micro lenses 52 of the lens array 50 are linearly arranged in two rows in a staggered manner in this embodiment, the micro lenses 52 can be arranged in a row or in a plurality of rows.

Although the light-blocking portion 53 is disposed between the two lens plates 51a and 51b in this embodiment, the light-blocking portion 53 can be disposed between the micro lenses 52 and the light emitting portions 41, or between the micro lenses 52 and the image plane.

Although the LED array including a plurality of LED elements is used as the light emitting portions 41 in this embodiment, organic EL (Electric Luminescence) elements also can be used as the light emitting portions 41. Further, semiconductor lasers can be used as the recording head of the printer 10. Alternatively, a light source such as a fluorescent lamp, halogen lamp or the like can be used in combination with a shutter composed of a liquid crystal display.

The lens array 50 of this embodiment can be used in an illumination apparatus that emits light to a predetermined position, a ultra-violet ray irradiation apparatus that emits the ultra-violet ray to a predetermined position, or a back light unit provided in an LCD (liquid crystal display).

Further, the lens array 50 of this embodiment can be used as an optical system of a display apparatus that displays images, characters or the like in which focused images of the light emitting portions 41 are formed on a predetermined position. The lens array 50 of this embodiment can be used as an optical system of an optical projector such as an LCD projector, or a light-switching type projector using DMD (digital micro mirror device: trademark).

Furthermore, the lens array 50 of this embodiment can be used in a reading apparatus such as a scanner, a facsimile or the like that reads images, characters or the like, a reading apparatus of a biometrics recognition system that reads fingerprints, veins or the like, a sensor that detects the shape or position of an object, or the like.

In FIG. 8, the mark CL indicates a center line passing through the center of the lens array 50 in the width direction, i.e., a line connecting the light emitting portion 41 and the focused image I. The mark Ax indicates the optical axis of the micro lens 52. The numerals 53a and 53b indicate the comb-like member and the partition plate.

The operation of the above described lens array 50 will be described.

Figure 9:
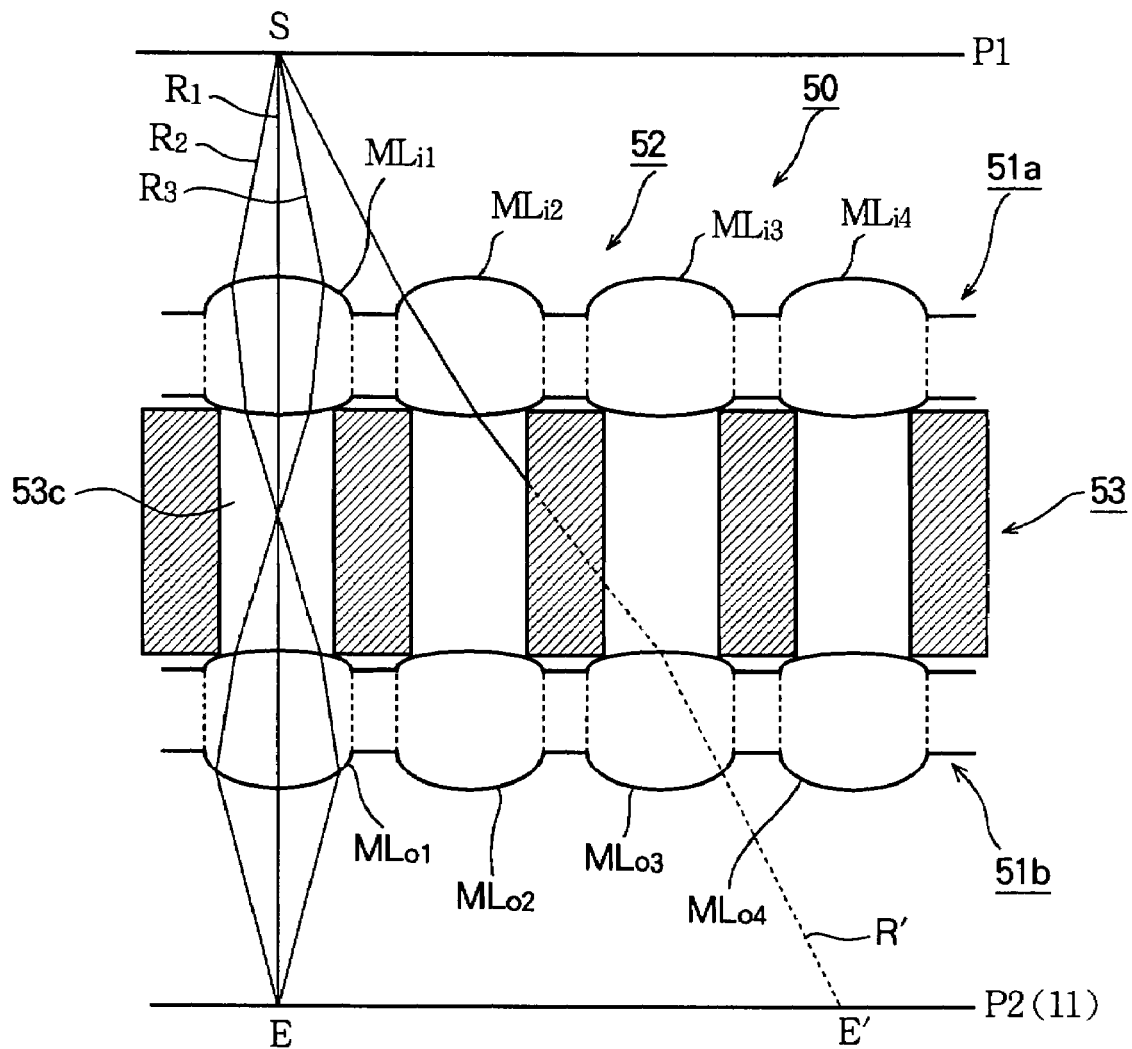
FIG. 9 is a schematic view showing a light path of the lens array according to the first embodiment of the present invention.

FIG. 9 shows a light path of the lens array according to the first embodiment of the present invention.

In FIG. 9, only one light emitting point S of the light emitting portions 41 (FIG. 8), four pairs of micro lenses $ML_{i1}$, $ML_{i2}$, $ML_{i3}$, $ML_{i4}$, $mL_{o1}$, $ML_{o2}$, $ML_{o3}$ and $ML_{o4}$, the light-blocking portion 53 and the photosensitive drum 11 are shown.

In FIG. 9, the focused image E of the light emitting point S focused by the lens array 50, and the light paths between the light emitting point S and the focused image E are also shown. A light ray traveling along the shortest path of the lens array 50 is defined as a principal ray $R_1$, and light rays travelling along the outermost path of the micro lenses $ML_{i1}$ and $ML_{o1}$ are defined as rim rays $R_2$ and $R_3$. The mark E' indicates an image of the light emitting point S focused by the micro mirrors $ML_{i2}$ and $ML_{o3}$ in the case where the light-blocking portion 53 is not provided. The mark R' indicates the light path in the case where the light-blocking portion 53 is not provided. Further, in FIG. 9, the marks 51a and 51b indicate the lens plates.

As shown in FIG. 9, the light ray incident on the closest micro lens $ML_{i1}$ from the light emitting point S is once collected at the opening 53c of the light-blocking portion 53, and is incident on the micro lens $ML_{o1}$ to form the focused image E on the surface of the photosensitive drum 11. The light ray incident on the micro lens $ML_{i2}$ adjacent to the micro lens $ML_{i1}$ is blocked by the light-blocking portion 53, and does not reach the photosensitive drum 11.

Here, the operation of the lens array of a comparative example with respect to the specific example of the first embodiment will be described. The lens array of the comparative example has no light-blocking portion 53. In the comparative example, the light ray incident on the micro lens $ML_{i2}$ adjacent to the closest micro lens $ML_{i1}$ from the light emitting point S proceeds along the light path shown by the mark R' in FIG. 9, and reaches the surface of the photosensitive drum 11 to form the focused image E'. Since the focused image of the light emitting point S must be formed as the focused image E, the light ray reaching the focused image E' causes the degradation of the contrast of the focused image E (of the light emitting point S) on the surface of the photosensitive drum 11.

Using the LED head 23 according to specific example of the first embodiment, the MTF (Modulation Transfer Function, i.e., amplitude transfer function) representing the resolution of the focused image E is measured. As a result of measurement, it is found that the MTF is 91%.

Figure 10:
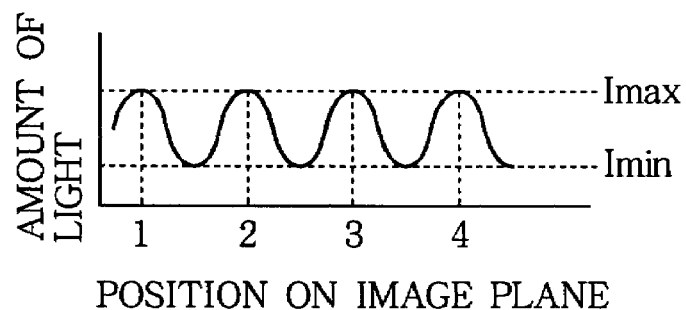
FIG. 10 is a graph showing a distribution of amount of light according to the comparative example.

FIG. 10 shows a distribution of the amount of light according to the first embodiment of the present invention. In FIG. 10, the horizontal axis indicates the position on the image plane, and the vertical axis indicates the amount of light. Numerals 1, 2, 3 and 4 along the horizontal axis indicate respective positions corresponding to the light emitting portions (the LED elements) 41 that are activated.

The MTF represents the resolution of the focused image of the LED head 23 (FIG. 2), and also represents the contrast of the focused image formed by activated LED elements of the LED head 23. When the MTF is 100%, the contrast of the focused image is the highest, and therefore the resolution of the LED head 23 is the highest. As the MTF becomes lower, the contrast of the focused image becomes smaller, and therefore the resolution of the LED head 23 becomes lower.

In this case, the MTF (%) is defined as follows:

$$MTF = ((I_{max} - I_{min})/(I_{max} + I_{min})) \times 100 (\%)$$

where $I_{max}$ is a maximum of the amount of light forming the focused image, and $I_{min}$ is a minimum of the amount of light between the focused images adjacent to each other.

On the measurement of the MTF and the amount of light, a microscopic digital camera is used to take the focused image at a position distanced from the end surface of the lens array 50 on the image plane side (i.e., the photosensitive drum 11 side) by the distance $L_I$(mm). Based on the image taken by the microscopic digital camera, the distribution of the amount of light forming the focused image of the light emitting portion 41 is analyzed, and the MTF and the amount of light are calculated.

For this purpose, the lens array 50 of the specific example of the first embodiment is mounted on the LED head 23 of the color LED printer having the resolution of 1200 dpi. In the LED head 23, 1200 LED elements are arranged per inch (approximately 25.4 mm). On the measurement of the MTF, the LED elements are alternately activated, and the maximum amount of light $I_{max}$ and the minimum amount of light $I_{min}$ are measured. On the measurement of the amount of light, all of the LED elements are activated at the same time, and the amount of light is determined as an average of the amounts of lights measured for the respective LED elements (the light emitting portions 41).

As a result of accumulated evaluations using the color LED printer, it has been clear that there is no degradation of the quality of the image formed on the sheet such as a density unevenness (appearing in a high-density region), stripes, roughness or the like, when the MTF is greater than or equal to 70%.

It is found that, when the image is formed using the lens array 50 of the specific example of the first embodiment, there is no degradation of the image quality such as a density unevenness, stripes, roughness or the like.

Figure 11:
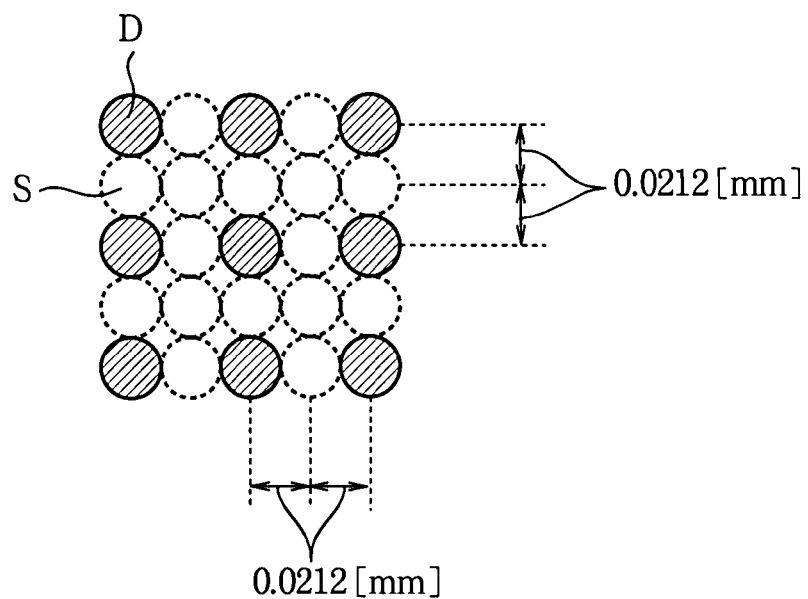
FIG. 11 shows "1×1" image used in the experiment in the first embodiment of the present invention.

FIG. 11 shows a "1×1" image of 1200 dpi used in the experiment according to the first embodiment of the present invention. Since the resolution is 1200 dpi, when all of the LED elements (arranged at the interval of 0.0212 mm) are activated, the dots are formed on the sheet at the interval (i.e., the pitch) of 0.0212 mm.

The evaluation of the image formed by the printer is performed using the "1×1" image shown in FIG. 11. The "1×1" image is formed by alternately activating the LED elements (arranged at the interval of 0.0212 mm) in the vertical and horizontal directions, so that the dots D and blank spaces S are alternately arranged in the vertical and horizontal directions. In other words, the dots D are formed at the interval of 0.0423 mm (=0.0212 mm×2). Based on the "1×1" image, the image quality is evaluated.

As the image formed by the above described LED color printer using the lens array 50 (FIG. 3) of the specific example of the first embodiment is evaluated, no degradation of the image quality (such as a density unevenness, stripes, roughness or the like) is observed.

In the first embodiment, the light-blocking portion 53 is formed of the comb-like members 53a on which grooves 53m are formed. That is, the light-blocking portion 53 is formed without a process of machining through-holes on the light-blocking portion 53. Therefore, even when the arrangement interval $P_Y$ of the openings 53c is small, the machining process is easy. Thus, the openings 53c can be easily formed, with the result that the light-blocking portion 53 can be easily formed.

In this regard, in order to integrally form the light-blocking portion 53 with openings having the same shapes as those of the specific example of the first embodiment using resin molding, it is necessary to provide pins having shapes corresponding to the openings 53c in the mold. The opening 53c has substantially a cylindrical shape having the radius $r_A$ of 0.45 mm and the thickness t of 2.5 mm in the direction of the optical axis. Since the pins of the mold have shapes and dimensions corresponding to the openings 53c, the durability of the pins is relatively low. Therefore, it is necessary to replace the pins with new ones after the mold is used to form small number of light-blocking portions 53.

However, the openings 53c are arranged at the arrangement interval $P_Y$ of 1.2 mm and arranged in two rows. Therefore, in order to manufacture the light-blocking portion 53 corresponding to the width of the sheet of A4 size (i.e., 210 mm), it is necessary to form approximately 350 openings 53c. Further, in order to manufacture the light-blocking portion 53 corresponding to the width of the sheet of A3 size (i.e., 297 mm), it is necessary to form approximately 495 openings 53c. The number of pins provided in the mold is the same as the number of the openings 53c of the light-blocking portion 53, and therefore 300 to 500 pins need to be replaced. Accordingly, the mass-productivity may decrease, and the manufacturing cost may increase.

In contrast, according to the first embodiment of the present invention, the comb-like member 53a can be formed using a mold in which projections having the shapes corresponding to the openings 53c (i.e., the grooves 53m) are formed. The projections of the mold have higher durability than the above described pins, and therefore it is not necessary to replace the projections. Accordingly, the mass-productivity can be enhanced, and the manufacturing cost can be reduced.

Furthermore, the dimensional error of the arrangement interval $P_Y$ of the openings 53c can be reduced, and the machining accuracy of the openings 53c can be enhanced. Therefore, the openings 53c can be formed correctly in accordance with the positions of the micro lenses 52. As a result, it becomes possible to obtain the LED head 23 having the lens array 50 with high resolution, and it becomes possible to form the image on the sheet in accordance with the print data.

Second Embodiment

Next, the second embodiment of the present invention will be described. Elements having the same structures as those of the first embodiment are assigned the same reference numerals. Regarding the advantages obtained by the same structures, the description in the first embodiment is herein incorporated.

Figure 12:
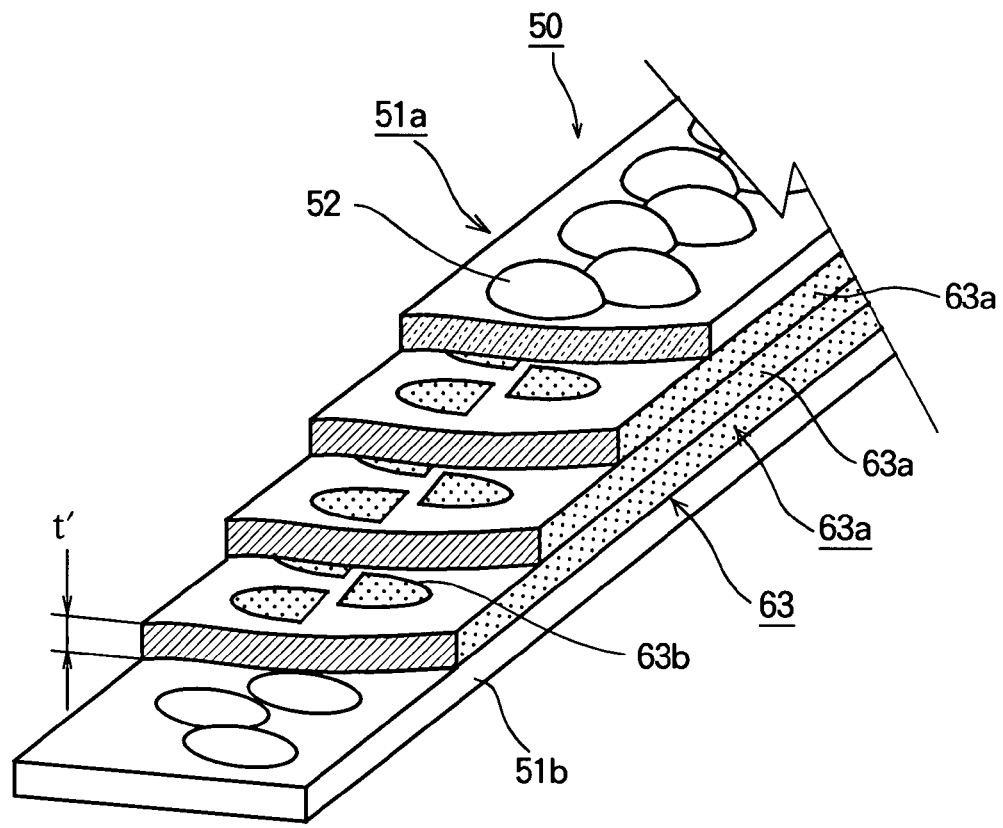
FIG. 12 is a partially cutaway perspective view showing a lens array according to the second embodiment of the present invention.
Figure 13:
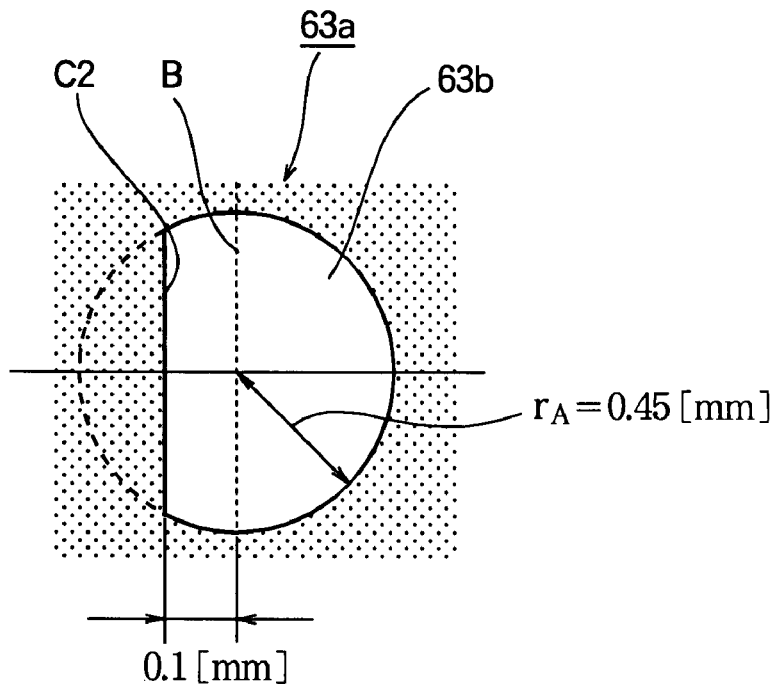
FIG. 13 is a plan view showing a part of the lens array according to the second embodiment of the present invention.
Figure 14:
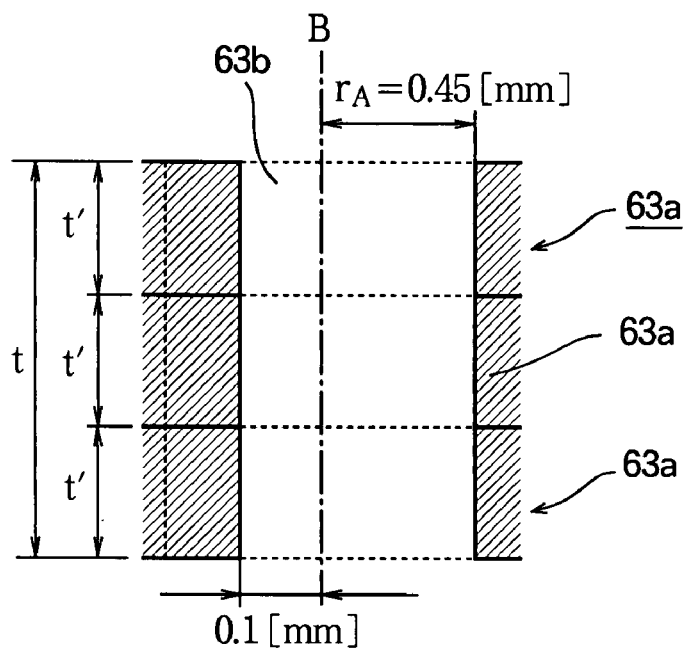
FIG. 14 is a sectional view showing the part of the lens array according to the second embodiment of the present invention.

FIG. 12 is a partially cutaway perspective view of a lens array according to the second embodiment of the present invention. FIGS. 13 and 14 are a plan view and a sectional view of a part of the lens array according to the second embodiment of the present invention.

A light-blocking portion 63 of the second embodiment has a structure split in the direction of the optical axes of the micro lenses 52 (i.e., in the direction of the thickness of the lens array 50). The light-blocking portion 63 is formed by layering a plurality of (in this example, three) light-blocking plates 63a. Each of the light-blocking plates 63a has openings 63b (as light-transmitting portions) arranged at an arrangement interval $P_Y$ and arranged in two rows in a staggered manner. The light-blocking plate 63a has the thickness t' in the direction of the optical axes of the micro lenses 52. Each of the openings 63b has a shape of a circle cut off by a plane. To be more specific, each of the openings 63b has a shape of a circle cut off at a distance of 0.1 mm from the center of the circle by a plane C2 parallel to a plane B (FIG. 13) extending in the arranging direction of the openings 63b and passing through the centers of the openings 63b. The light-blocking plates 63a having the openings 63b are formed of material that blocks the light emitted by the light source (i.e., the light emitting portions 41). In this embodiment, the light-blocking plate 63a has the thickness t' of 0.8 mm in the direction of the optical axes of the micro lenses 52 (hereinafter, simply referred to as the direction of the optical axis). The light-blocking plate 63a is formed by etching a stainless sheet metal, and by forming non-reflective coating layer on the stainless sheet metal by means of chrome-treatment. The arrangement interval $P_Y$ of the openings 63b is 1.200 mm, and the radius $r_A$ of each opening 63b is 0.45 mm.

In the second embodiment, the light-blocking plate 63a is formed by machining the stainless sheet metal. However, the light-blocking plate 63a can be obtained by forming a light-blocking pattern on a material that transmits the light emitted by the light source. Alternatively, the light-blocking plate 63a can be obtained by forming a light-blocking pattern on parts of the lens plates 51a and 51b. The light-blocking plate 63a can be formed by roughing parts of the surfaces of the lens plates 51a and 51b to block the light. The light-blocking plate 63a can be formed by cutting off the lens plates 51a and 51b to prevent the incidence of the light.

According to the second embodiment, the light-blocking portion 63 is formed by layering the light-blocking plates 63a each having the thickness t' in the direction of the optical axis, and therefore it is not necessary to form through-holes that penetrate the light-blocking portion 63 having the thickness t in the direction of the optical axis. Since it is only necessary to form through-holes penetrating each light-blocking plate 63a having the thickness t' in the direction of the optical axis, the mass-productivity can be enhanced, and the manufacturing cost can be reduced.

In this regard, it is difficult to entirely form the light-blocking portion 63 whose openings have the same shapes as the openings 63b of the second embodiment using the etching of a sheet metal. This is because each opening 63b has a substantially cylindrical shape having the radius $r_A$ of 0.45 mm and the depth (equal to the thickness t) of 2.5 mm in the direction of the optical axis.

To be more specific, in an etching process, a metal is solved from the surface of a sheet metal toward the inside. Therefore, if the thickness (depth) of the opening (i.e., the through hole) is greater than the inner diameter of the opening, the inner diameter may become smaller at the center portion in the thickness direction, or the opening may not be formed at the center portion in the thickness direction. As a result, the openings are not correctly formed.

In contrast, according to the second embodiment, each light-blocking plate 63a has the thickness t' of 0.8 mm in the direction of the optical axis, which is smaller than the inner diameter of the opening 63b, and therefore it becomes possible to form openings 63b of the desired shape. In this regard, in the case where the respective light-blocking plates 63a are bonded to each other using adhesive agent, the thickness of the light-blocking portion 63 is thicker than the total thickness of the light-blocking plates 63a by the thickness of the adhesive agent. Therefore, the thickness t' of each light-blocking plate 63a in the direction of the optical axis is set to be slightly thinner than the value obtained by dividing the thickness t of the light-blocking portion 63 in the direction of the optical axis by the number of the light-blocking plates 63a.

Accordingly, the mass-productivity can be enhanced, and the manufacturing cost can be reduced.

Moreover, the light-blocking portion 63 is formed by layering a plurality of light-blocking plates 63a, and therefore the strength of the lens array 50 can be enhanced.

Further, the dimensional error of the arrangement interval $P_Y$ of the openings 63b can be reduced, and therefore the machining accuracy of the openings 63b can be enhanced. Therefore, the openings 63b can be formed correctly in accordance with the positions of the micro lenses 52. As a result, it becomes possible to form the LED head 23 as an exposure device or a recording head with high resolution using the lens array 50, and to form an image according to the print data on the sheet.

Third Embodiment

The third embodiment of the present invention will be described. Elements having the same structures as those of the first or second embodiment are assigned the same reference numerals. Regarding the advantages obtained by the same structures, the description in the first or second embodiment is herein incorporated.

Figure 15:
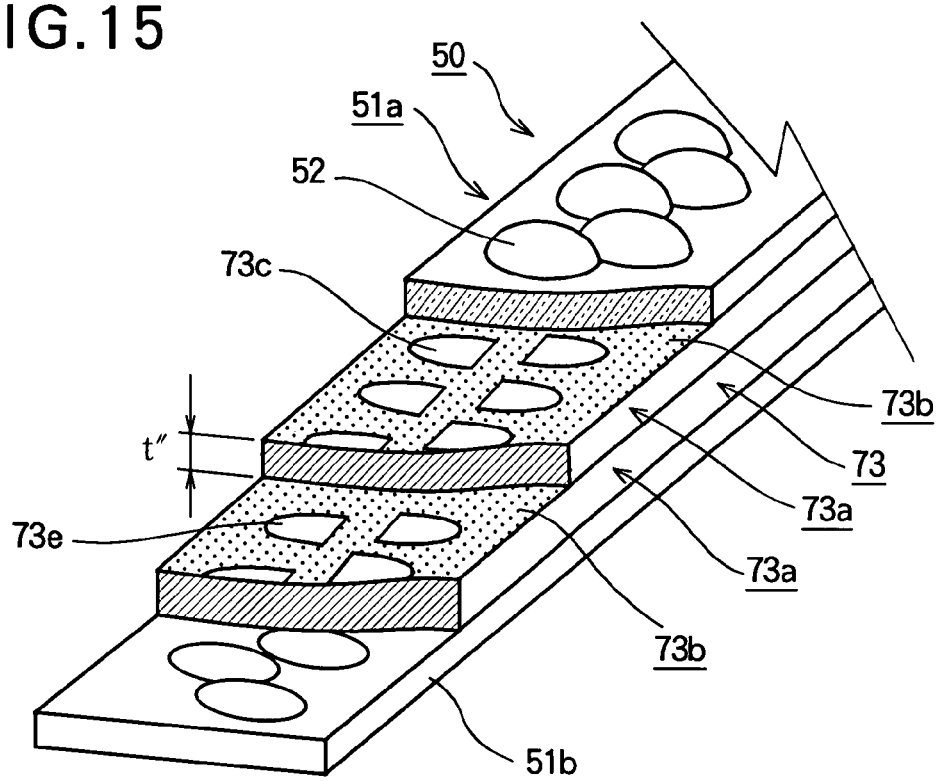
FIG. 15 is a partially cutaway perspective view showing a lens array according to the third embodiment of the present invention.
Figure 16:
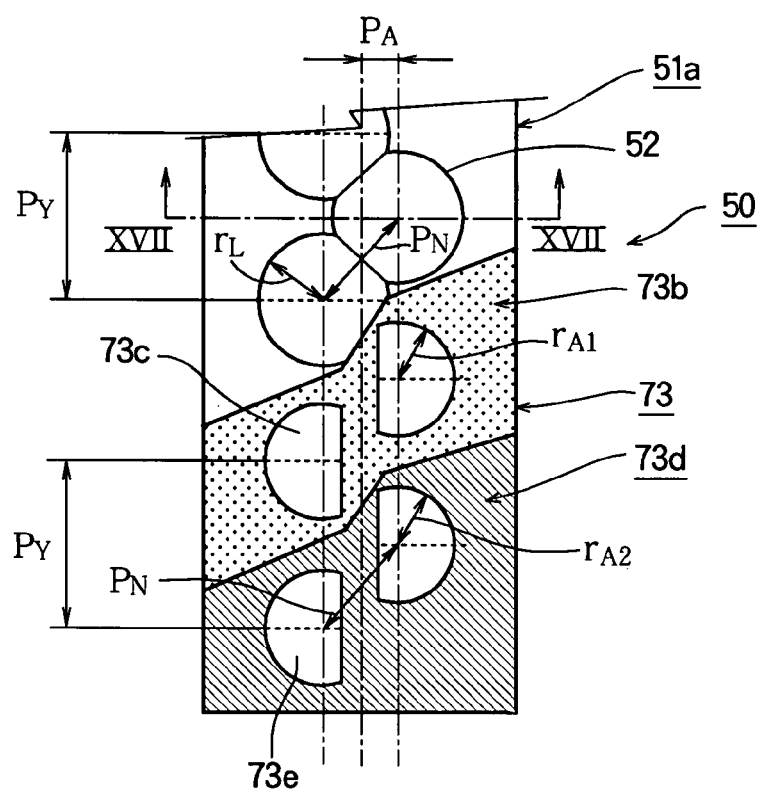
FIG. 16 is a partially cutaway plan view showing the lens array according to the third embodiment of the present invention.
Figure 17:
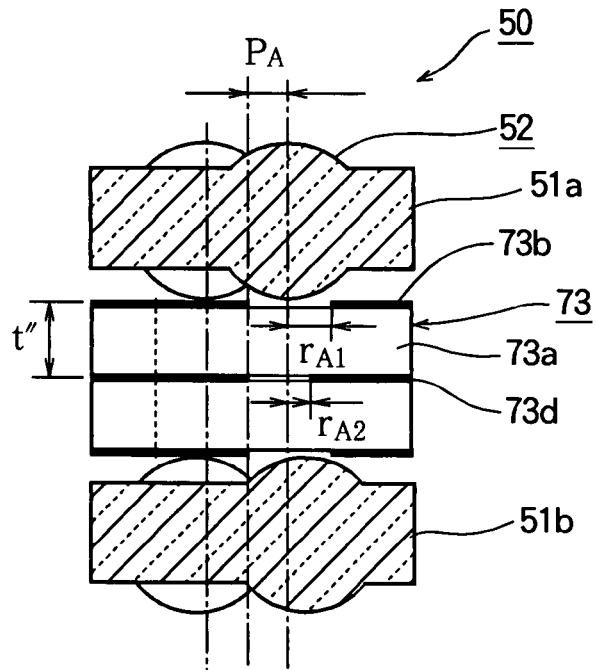
FIG. 17 is a cross sectional view taken along line XVII-XVII shown in FIG. 16.
Figure 18:
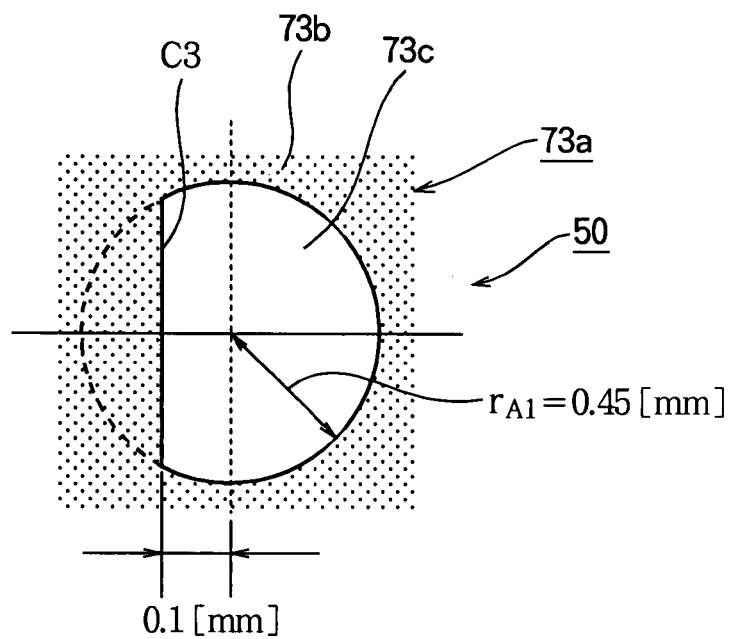
FIG. 18 is a plan view showing a part of the lens array according to the third embodiment of the present invention.
Figure 19:
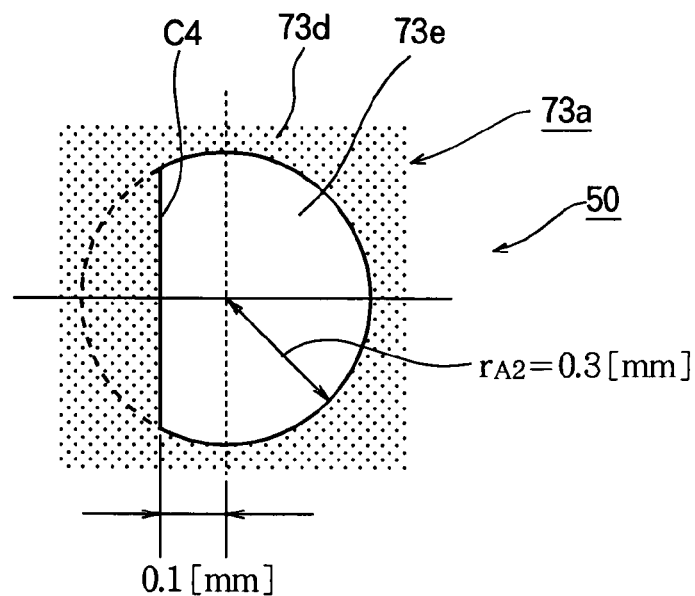
FIG. 19 is a plan view showing another part of the lens array according to the third embodiment of the present invention.

FIG. 15 is a partially cutaway perspective view of a lens array according to the third embodiment of the present invention. FIG. 16 is a partially cutaway plan view of the lens array according to the third embodiment of the present invention. FIG. 17 is a sectional view taken along line XVII-XVII in FIG. 16. FIG. 18 is a plan view showing a part of the lens array according to the third embodiment of the present invention. FIG. 19 is a plan view showing another part of the lens array according to the third embodiment of the present invention.

As shown in FIGS. 15 through 17, a light-blocking portion 73 of the third embodiment is formed by layering a plurality of (in this example, two) transparent plates 73a. Further, as shown in FIG. 17, light-blocking patterns 73b (that block the light) are formed on surfaces of the transparent plates 73a respectively facing the lens plates 51a and 51b. Furthermore, light-blocking patterns 73d (that block the light) are formed on surfaces of the transparent plates 73a facing each other, i.e., at the center portion of the light-blocking portion 73 in the direction of the optical axis. The light-blocking patterns 73b have transparent portions 73c as light-transmitting portions, i.e., first openings. The light-blocking patterns 73d have transparent portions 73e as light-transmitting portions, i.e., second openings. The transparent portions 73c (73e) have shapes of circles partially cut off by planes, and are linearly disposed in two rows at an arrangement interval $P_Y$ in a staggered manner. The thickness of each transparent plate 73a (in the direction of the optical axis) is expressed as t". The radius of the transparent portion 73c is expressed as $r_{A1}$, and the radius of the transparent portion 73e is expressed as $r_{A2}$. The radius $r_{A2}$ of the transparent portion 73e (at the center portion of the light-blocking portion 73) is smaller than the radius $r_{A1}$ of the transparent portion 73c (at the end portions of the light-blocking portion 73 facing the micro lenses 52). In other words, the following relationship is satisfied:

$r_{A1} > r_{A2}$.

In this embodiment, the arrangement interval $P_Y$ is 1.200 mm, the radius $r_{A1}$ is 0.45 mm, and the radius $r_{A2}$ is 0.3 mm. The thickness t" (in the direction of the optical axis) of each transparent plate 73a is 1.25 mm.

As shown in FIG. 18, the transparent portion 73c (the first opening) has a shape bounded by a circle of the radius $r_{A1}$ and a plane C3 extending in the arranging direction of the transparent portions 73c at a distance of 0.1 mm from the center of the circle. As shown in FIG. 19, the transparent portion 73e (the second opening) has a shape bounded by a circle of the radius $r_{A2}$ and a plane C4 extending in the arranging direction of the transparent portions 73e at a distance of 0.1 mm from the center of the circle.

The transparent plate 73a is formed of a member (in this example, a glass plate) composed of a material that transmits the light emitted by the light source (i.e., the light emitting portions 41). The light-blocking patterns 73b and 73d are composed of material (in this example, a black coating) that blocks the light from the light source. The transparent plate 73a can be obtained by, for example, forming openings on a plate-like member with light-blocking surfaces that blocks the light from the light source.

The lens array of comparative example is prepared for the verification of the advantage of the third embodiment. In the comparative example, the radius $r_{A1}$ of the transparent portion 73c is 0.45 mm, and the radius $r_{A2}$ of the transparent portion 73e is 0.45 mm.

The operation of the above described lens array 50 will be described.

Figure 20:
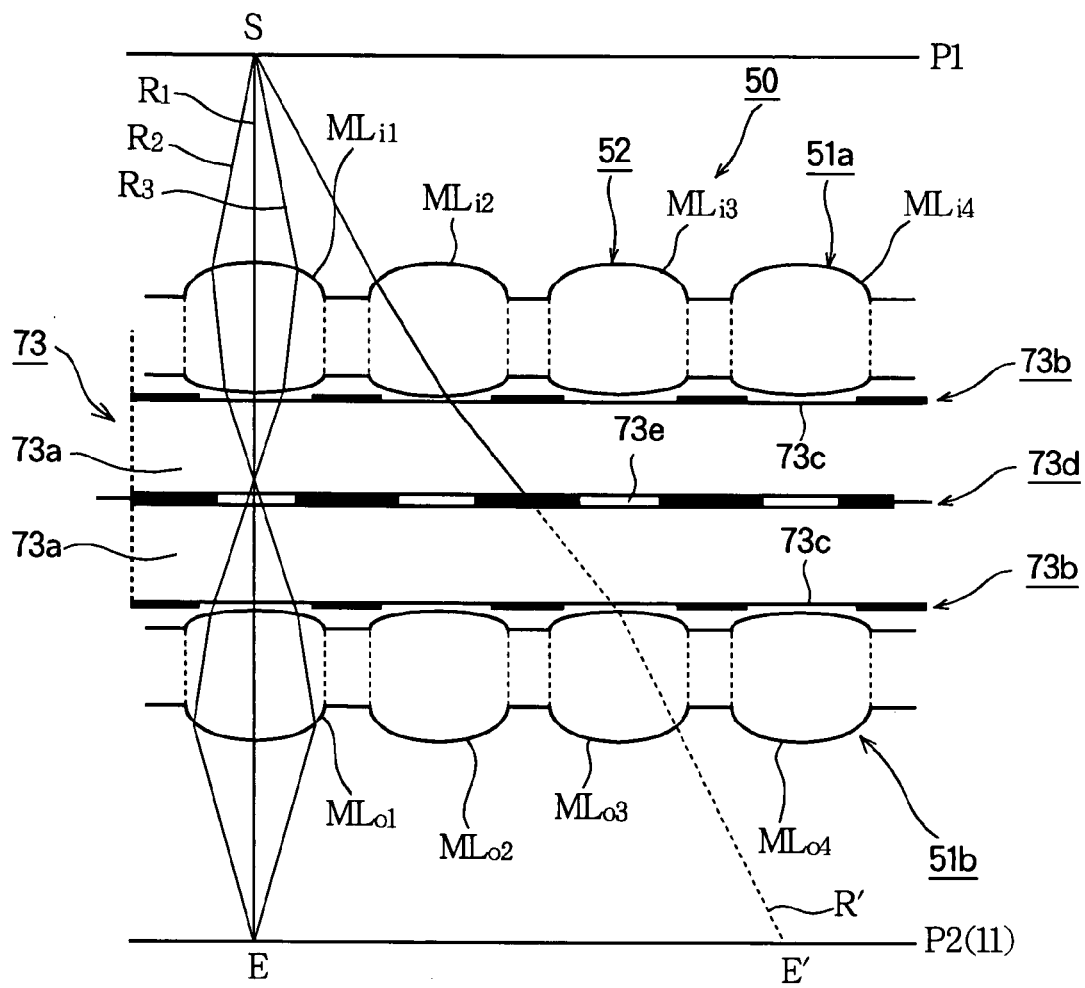
FIG. 20 is a schematic view showing a light path of the lens array according to the third embodiment of the present invention.

FIG. 20 shows a light path of the lens array 50 according to the third embodiment of the present invention.

In FIG. 20, only one light emitting point S (of the light emitting portions 41 shown in FIG. 8), four pairs of micro lenses $ML_{i1}$, $ML_{i2}$, $ML_{i3}$, $ML_{i4}$, $ML_{o1}$, $ML_{o2}$, $ML_{o3}$ and $ML_{o4}$, the light-blocking portion 73 and the photosensitive drum 11 are shown.

Further, in FIG. 20, the focused image E of the light emitting point S focused by the lens array 50, and the light paths between the light emitting point S and the focused image E are also shown. A light ray traveling along the shortest path of the lens array 50 is defined as a principal ray $R_1$, and light rays travelling along the outermost path of the micro lenses $ML_{i1}$ and $ML_{o1}$ are defined as rim rays $R_2$ and $R_3$. The above described focused image E' is an image of the light emitting point S focused by the micro mirrors $ML_{i2}$ and $ML_{o3}$ in the case where the light-blocking portion 73 is not provided. The mark R' indicates the light path in the case where the light-blocking portion 73 is not provided.

As shown in FIG. 20, the light ray incident on the closest micro lens $ML_{i1}$ from the light emitting point S is once collected at the transparent portion 73e of the light-blocking portion 73, and is incident on the micro lens $ML_{o1}$ to form the focused image E on the surface of the photosensitive drum 11. In the case where the light-blocking portion 73 is not provided, the light ray incident on the micro lens $ML_{i2}$ adjacent to the micro lens $ML_{i1}$ reaches the photosensitive drum 11. Since the focused image of the light emitting point S must be formed as the focused image E, the light ray reaching the focused image E' causes the degradation of the contrast of the focused image E (of the light emitting point S) on the surface of the photosensitive drum 11.

In the third embodiment, the radii $r_{A1}$ and $r_{A2}$ of the transparent portions 73c and 73e of the light-blocking portion 73 satisfy the relationship:

$$r_{A1} > r_{A2}.$$

With such a relationship, the light-blocking portion 73 sufficiently blocks the light ray that may cause the degradation of the contrast of the focused image E of the light emitting portion S, and therefore the contrast of the focused image E can be enhanced.

As the MTF is measured using the LED head 23 (FIG. 2) of the third embodiment in which the radius $r_{A1}$ of the transparent portion 73c is 0.45 mm and the radius $r_{A2}$ of the transparent portion 73e is 0.3 mm, it is found that the MTF is 85%. In contrast, as the MTF is measured using the LED head of the comparative example in which the radius $r_{A1}$ of the transparent portion 73c is 0.45 mm and the radius $r_{A2}$ of the transparent portion 73e is 0.45 mm, it is found that the MTF is 69%.

As a result of accumulated evaluations using the color LED printer, it has been clear that there is no degradation of the quality of the image formed on the sheet such as a density unevenness (appearing in a high-density region), stripes, roughness or the like, when the MTF is greater than or equal to 70%.

It is found that, when the image is formed using the lens array of the comparative example, the degradation of the image quality (such as density unevenness, stripes, roughness or the like) occurs. In contrast, it is found that, when the image is formed using the lens array 50 of the third embodiment, there is no degradation of the image quality (such as density unevenness, stripes, roughness or the like).

As described above, according to the third embodiment, the light-blocking portion 73 is obtained by forming the light-blocking patterns 73b and 73d on the transparent plates 73a leaving the transparent portions 73c and 73e. Therefore, the operation for forming the light-blocking portion 73 can be simplified.

The above described third embodiment can be applied to the lens array of the first embodiment. To be more specific, the comb-like members 53a (FIG. 3) can be formed of material that transmits light, and light-blocking patterns can be formed on the surfaces of the comb-like members 53a so as to leave light-transmitting portions on the comb-like members 53a.

In the first through third embodiments, the printer has been described as an example of an image forming apparatus. However, the present invention is applicable to a copier, a facsimile, a compound machine or the like.

While the preferred embodiments of the present invention have been illustrated in detail, it should be apparent that modifications and improvements may be made to the invention without departing from the spirit and scope of the invention as described in the following claims.

The invention claimed is:

1. A lens array comprising:
   a plurality of lens pairs each of which includes a plurality of lenses so disposed that optical axes thereof are aligned with each other, said lens pairs being arranged in a direction perpendicular to said optical axes, and
   a light-blocking portion provided between said lens pairs and configured to partially block light passing through at least one lens of said lens pairs,
   wherein said light-blocking portion is formed to have a structure split into at least two parts in a width direction of said lens array, said width direction being perpendicular to a direction in which said lens pairs are arranged and being perpendicular to said optical axes.

2. A lens array comprising:
   a plurality of lens pairs each of which includes a plurality of lenses so disposed that optical axes thereof are aligned with each other, said lens pairs being arranged in a direction perpendicular to said optical axes, and
   a light-blocking portion provided between said lens pairs and configured to partially block light passing through at least one lens of said lens pairs,
   wherein said light-blocking portion is formed to have a structure split into at least two parts in a thickness direction of said lens array, said parts being overlapped with each other in said thickness direction, said thickness direction being parallel to said optical axes.

3. The lens array according to claim 1, wherein said light-blocking portion includes a light-blocking pattern formed on a light-transmitting member so as to leave a light-transmitting portion on said light-transmitting member, and
   wherein said light-transmitting portion transmits light emitted by a predetermined light source, and said light-blocking pattern blocks light emitted by said light source.

4. The lens array according to claim 3, wherein said light-transmitting member is split into at least two parts in the direction of said optical axis, and wherein said light-transmitting portion is smaller at a center portion of said light-blocking portion in the direction of said optical axes than at an end portion of said light-blocking portion.

5. The lens array according to claim 1, wherein said light-blocking portion includes a plurality of comb-like members arranged in the width direction of said lens array and a partition plate disposed between said comb-like members.

6. The lens array according to claim 5, wherein said comb-like members have grooves, and said grooves constitute openings of said light-blocking portion that transmits light emitted by a predetermined light source.

7. The lens array according to claim 2, wherein said light-blocking portion includes a plurality of light-blocking plates layered in the direction of said optical axes, and each of said light-blocking plates has a plurality of openings that transmit light emitted by a predetermined light source.

8. The lens array according to claim 1, wherein said lens pairs include a pair of lens plates disposed on both sides of said light-blocking portion in the direction of said optical axes.

9. An exposure device comprising:
a lens array according to claim 1.

10. An image forming apparatus comprising:
said exposure device according to claim 9.

11. An LED head comprising an LED array and a lens array disposed between said LED array and an image bearing body, said lens array comprising:
a plurality of lens pairs each of which includes a plurality of lenses so disposed that optical axes thereof are aligned with each other, said lens pairs being arranged in a direction perpendicular to said optical axes, and
a light-blocking portion provided between said lens pairs and configured to partially block light passing through at least one lens of said lens pairs,
wherein said light-blocking portion is formed to have a structure split into at least two parts in a width direction of said lens array, said width direction being perpendicular to a direction in which said lens pairs are arranged and being perpendicular to said optical axes.

12. The lens array according to claim 1, wherein said lens pairs are arranged in two rows in a zigzag manner, wherein said light-blocking portion includes first and second light-blocking members respectively disposed corresponding to said rows and a third light-blocking member disposed corresponding to a position between said rows.

13. The lens array according to claim 12, wherein each of said first and second light-blocking members has a plurality of grooves extending parallel to said optical axes, and said third light-blocking member is disposed so as to cover said grooves.

14. A lens array comprising:
a plurality of lens pairs each of which includes a plurality of lenses so disposed that optical axes thereof are aligned with each other, said lens pairs being arranged in a direction perpendicular to said optical axes, and
a light-blocking portion provided between said lens pairs and configured to partially block light passing through at least one lens of said lens pairs,
wherein said light-blocking portion is formed to have a structure split into at least two split parts in a predetermined direction, and
wherein said light-blocking portion has openings for passing light therethrough, and at least one of said opening is formed by a combination of said at least two split parts.

15. A lens array comprising:
a plurality of lens pairs each of which includes a plurality of lenses so disposed that optical axes thereof are aligned with each other, said lens pairs being arranged in a direction perpendicular to said optical axes, and
a light-blocking portion provided between said lens pairs and configured to partially block light passing through at least one lens of said lens pairs,
wherein said light-blocking portion is formed to have a structure split into a plurality of parts in a predetermined direction, and
wherein said light-blocking portion has openings for passing light therethrough, and at least one of said opening is formed by said plurality of parts,
wherein said predetermined direction is a width direction of said lens array, said width direction being perpendicular to a direction in which said lens pairs are arranged and being perpendicular to said optical axes.

16. A lens array comprising:
a plurality of lens pairs each of which includes a plurality of lenses so disposed that optical axes thereof are aligned with each other, said lens pairs being arranged in a direction perpendicular to said optical axes, and
a light-blocking portion provided between said lens pairs and configured to partially block light passing through at least one lens of said lens pairs,
wherein said light-blocking portion is formed to have a structure split into a plurality of parts in a predetermined direction, and
wherein said light-blocking portion has openings for passing light therethrough, and at least one of said opening is formed by said plurality of parts,
wherein said predetermined direction is a thickness direction of said lens array, said thickness direction being parallel to said optical axes.

17. The lens array according to claim 8, wherein the lenses are formed on the lens plates, and each lens, taken from a plan view of the lens plates, has a shape of a circle which is partially cut off.

18. The lens array according to claim 17, wherein the light-blocking portion has a plurality of openings, and each opening, taken from a plan view of the lens plates, has a shape of a circle which is partially cut off.

19. The lens array according to claim 1, wherein two adjacent parts of said at least two parts of said light-blocking portion are in contact with each other.

20. The LED head according to claim 11, wherein two adjacent parts of said at least two parts of said light-blocking portion are in contact with each other.

21. The lens array according to claim 14, wherein two adjacent parts of said at least two split parts of said light-blocking portion are in contact with each other.

* * * * *